(12) United States Patent
Yu et al.

(10) Patent No.: US 7,821,429 B2
(45) Date of Patent: Oct. 26, 2010

(54) PARALLEL TO SERIAL CONVERSION CIRCUIT

(75) Inventors: Qianyu Yu, Shanghai (CN); Josh Chiachi Yang, Shanghai (CN); Zhibing Deng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 36 days.

(21) Appl. No.: 12/430,019

(22) Filed: Apr. 24, 2009

(65) Prior Publication Data

US 2010/0123609 A1 May 20, 2010

(30) Foreign Application Priority Data

Nov. 17, 2008 (CN) ............ 2008 1 0202829

(51) Int. Cl.
*H03M 9/00* (2006.01)
(52) U.S. Cl. ................... 341/101; 341/144
(58) Field of Classification Search ......... 341/100–101, 341/136, 144
See application file for complete search history.

(56) References Cited

U.S. PATENT DOCUMENTS 5,243,347 A * 9/1993 Jackson et al. ............ 341/144
6,417,790 B1 * 7/2002 Fiedler et al. ............ 341/101
6,614,372 B1 * 9/2003 Shi ............................ 341/101
6,771,194 B2 * 8/2004 Shi ............................ 341/101

\* cited by examiner

*Primary Examiner*—Khai M Nguyen
(74) *Attorney, Agent, or Firm*—Squire, Sanders & Dempsey, L.L.P.

(57) ABSTRACT

A parallel to serial conversion circuit includes a plurality of switching units and a voltage output unit providing an operating voltage for the switching units. Each of the plurality of switching units is operable to receive a first clock signal and a second clock signal which have the same frequency, a phase shift exists between the first clock signal and the second clock signal for each of the switching units, and a phase difference exists between the first clock signals received by adjacent two switching units of the plurality of switching units. The plurality of switching units receive data bits of parallel data in sequence according to the phase difference, particularly, each of the plurality of switching units receives one data bit within a time window corresponding to the phase shift. In comparison with the prior art, the inventive solution implement the parallel to serial conversion using a single system clock frequency, so that the complexity and power consumption of the system is reduced.

8 Claims, 7 Drawing Sheets

PARALLEL TO SERIAL CONVERSION CIRCUIT

This application claims the priority of Chinese Patent Application No. 200810202829.4, filed Nov. 17, 2008, the entire disclosure of which is incorporated herein by reference.

FIELD OF THE INVENTION

The present invention relates to a parallel to serial conversion circuit.

BACKGROUND OF THE INVENTION

A parallel to serial conversion circuit is necessary for transmission of parallel data via a serial interface. A circuit diagram of conventional parallel to serial conversion circuit is shown in FIG. 1. The conventional parallel to serial conversion circuit includes a data conversion circuit 10 and a phase locked loop circuit 12, as shown in FIG. 1. The phase locked loop circuit 12 is operable to multiply the frequency of an inputted source clock to obtain a multiplied clock for the data conversion. The data conversion circuit 10 is operable to receive parallel data in synchronization with a parallel clock (e.g. a parallel transmission clock), convert the received parallel data into serial data in response to the multiplied clock from the phase locked loop circuit 12, and output the serial data in synchronization with a serial clock (e.g. a serial transmission clock). In the conventional parallel to serial conversion circuit, the phase locked loop circuit operates even if the parallel data to be transmitted is not inputted. In other words, the phase locked loop circuit oscillates at a frequency of free oscillation even if the inputted source clock to be multiplied is interrupted. Therefore, the phase locked loop circuit consumes a current of about several hundreds of μA even when the parallel data to be transmitted is not inputted.

A parallel to serial conversion device is disclosed in U.S. Pat. No. 6,771,194 entitled "Parallel to serial conversion device and method", as shown in FIG. 2, and the parallel to serial conversion device includes a plurality of current sources 10, 12, 14 and 16, a plurality of selecting means 18, 20, 22 and 24, a current steering means 26, and a voltage outputting means 28. The number of the current sources 10, 12, 14 and 16 and the number of the selecting means 18, 20, 22 and 24 correspond to the number of data bits of the parallel data being converted into the serial data. In the disclosure of U.S. Pat. No. 6,771,194, because only one bit of the parallel data is being converted at one time, clock signals $ck_1$, $ck_2$, $ck_3$ and $ck_4$ of the selecting means 18, 20, 22 and 24 are used to determine which of the selecting means 18, 20, 22 and 24 is in an active state (i.e. converting the data bit). For example, if the selecting means 18 is in the active state, the selecting means 18 and the corresponding current source 10 are provided with a first current $I_0$, while the other selecting means 20, 22 and 24 are provided with no current. Further, a second current $(n-1)*I_0$ is directed towards the current steering means 26, which in turn divides the second current $(n-1)*I_0$ and directs the divided second current $(n-1)*I_0$ to the selecting means 20, 22 and 24 respectively. Thus, only a current of $n*I_0$ is used for all tail currents, thereby reducing greatly the current consumption. In the disclosure of U.S. Pat. No. 6,771,194, the selecting means correspond to a clock signal with the highest frequency. In other words, if the clock frequency of the parallel data is $f_0$ and the number of bits of the parallel data is n, the clock signal corresponding to the selecting means has a frequency of $f=n*f_0$. For example, if the clock frequency of the parallel data is 100 MHz and the number of bits of the parallel data is 10, the clock signal corresponding to the selecting means has a frequency of 100 MHZ*10=1 GHz. The clock signal with such a high frequency is difficult to obtain, has a high requirement on the system and requires additionally a frequency multiplying means, as a result, the complexity of the system is increased. If the teachings of U.S. Pat. No. 6,771,194 are applied in a low frequency environment, the power consumption may be reduced, because the current consumption in the system is relatively low for some time due to signal switching. However, if the teachings of U.S. Pat. No. 6,771,194 is applied in a high frequency environment, due to the frequent signal switching, the system operates at a low current for a very short of time which may be ignored, and the system may be regarded as active all the time, thus the reduction of power consumption is insignificant.

In addition, U.S. Pat. No. 6,741,193 discloses a parallel in serial out circuit having flip-flop latching at multiple clock rates, and the parallel in serial out circuit may convert data bits of the parallel data into corresponding serial data by means of frequency division and multiple groups of flip-flop latching at various frequencies, for example, in an embodiment of U.S. Pat. No. 6,741,193, a frequency of 400 MHz is divided into frequencies of 50 MHz, 100 MHz, 200 MHz and 400 MHz. In the disclosures of U.S. Pat. No. 6,741,193, the highest frequency needs to be divided and the flip-flop latching at various frequencies is required. The increase in the data bits increases the frequency division times and the required flip-flop latches, which increases the system complexity and increase the power consumption for the frequency division, but fails to ensure accurate frequency division.

SUMMARY OF THE INVENTION

A parallel to serial conversion circuit is provided in the present invention, to decrease a clock frequency, complexity and power consumption in a system.

A parallel to serial conversion circuit provided in the present invention includes a plurality of switching units and a voltage output unit adapted to provide an operating voltage for the plurality of switching units. Each of the plurality of switching units is operable to receive a first clock signal and a second clock signal which have the same frequency. A phase shift exists between the first clock signal and the second clock signal for each switching unit, and a phase difference exists between the first clock signals received by adjacent two switching units of the plurality of switching units. The plurality of switching units receive data bits of the parallel data in sequence according to the phase difference, and each of the plurality of switching units receives one data bit within a time window corresponding to the phase shift.

Optionally, the conversion circuit may further include a common current source connected to the plurality of switching units.

Optionally, the switching unit may include a current-mode logic circuit.

Optionally, the current-mode logic circuit may include: a first group of serial-connected transistors including a first transistor, a second transistor and a third transistor, where a control terminal of the first transistor receives a first clock signal, a control terminal of the second transistor receives a second clock signal, and a control terminal of the third transistor receives one data bit of the parallel data; a second group of serial-connected transistors including a fourth transistor, a fifth transistor and a sixth transistor, where a control terminal of the fourth transistor receives the first clock signal, a control terminal of the fifth transistor receives the second clock signal, and a control terminal of the sixth transistor receives a logical complement value of one data bit of the parallel data; a first pull-up device connected between the voltage output unit and the first transistor; and a second pull-up device connected between the voltage output unit and the fourth transistor. The third and the sixth transistors are connected to a common conjunction point, a conjunction point between the first pull-up device and the first transistor is a second output terminal, a conjunction point between the second pull-up device and the fourth transistor is a first output terminal, and an output signal from the first output terminal and an output signal from the second output terminal are logical complement values with respective to each other.

Optionally, each of the first, second, third, fourth, fifth and sixth transistors in the current-mode logic circuit is a field effect transistor, and the control terminal is a gate of the field effect transistor.

Optionally, a phase difference of $$\Delta t = \frac{T}{N}$$

exists between two first clock signals or two second clock signals of the adjacent two switching units of the plurality of switching units, where $\Delta t$ denotes the phase difference, T denotes a period of a system clock for the parallel data, and N denotes the number of data bits in the parallel data.

Optionally, the phase shift is $$Ps = b*\Delta t = (N/2+1)*\frac{T}{N},$$

where Ps denotes the phase shift, b denotes a sequence difference of adjacent clock signals, T denotes a period of the system clock for the parallel data, and N denotes the number of data bits in the parallel data.

Optionally, the time window is $$\Delta T_w = \frac{T}{N},$$

where $\Delta T_w$ denotes the time window, T denotes a period of the system clock for the parallel data, and N denotes the number of data bits in the parallel data.

In the above solution of the present invention, a plurality of switching units corresponding to data bits of parallel data are provided, each of the plurality of switching units is provided with a first clock signal and a second clock signal having the same frequency, a phase shift exists between the first and second clock signals, and a phase difference exists between the first clock signals for the adjacent two switching units of the plurality of switching units, so that all data bits of the parallel data may be converted into serial data within one clock period. In comparison with the prior art, the frequency of each of the first and second clock signals in the solution above is the same as the clock frequency of the parallel transmission system. In other words, actually a single system clock frequency is used, thus it is not necessary to obtain a clock signal frequency equal to the product of the system clock frequency and the number of data bits of the parallel data through the frequency multiplying processing, or obtain several clock frequencies by means of frequency division, so that devices for the frequency multiplying or frequency division are omitted, and the complexity and power consumption of the system is reduced.

In addition, a common current source connected to the plurality of switching units is further provided in the solution of the present invention, so that the plurality of switching units may share the same tail current, ensuring a stable state where the tail current is always active, avoiding the defect in the prior art that the amplitude of a data bit is susceptible and the data bit may be misjudged due to the instability of the tail current at its rising edge and falling edge, because the switching units each are connected to the respective current sources.

DETAILED DESCRIPTION OF THE INVENTION

An embodiment of the present invention provides a parallel to serial conversion circuit including a plurality of switching units and a voltage output unit adapted to provide an operating voltage for the plurality of switching units. Each of the plurality of switching units is operable to receive a first clock signal and a second clock signal which have the same frequency. A phase shift exists between the first clock signal and the second clock signal for each switching unit, and a phase difference exists between the first clock signals received by adjacent two switching units of the plurality of switching units. The plurality of switching units receive data bits of the parallel data in sequence according to the phase difference, and each of the plurality of switching units receives one data bit within a time window corresponding to the phase shift.

Figure 1:
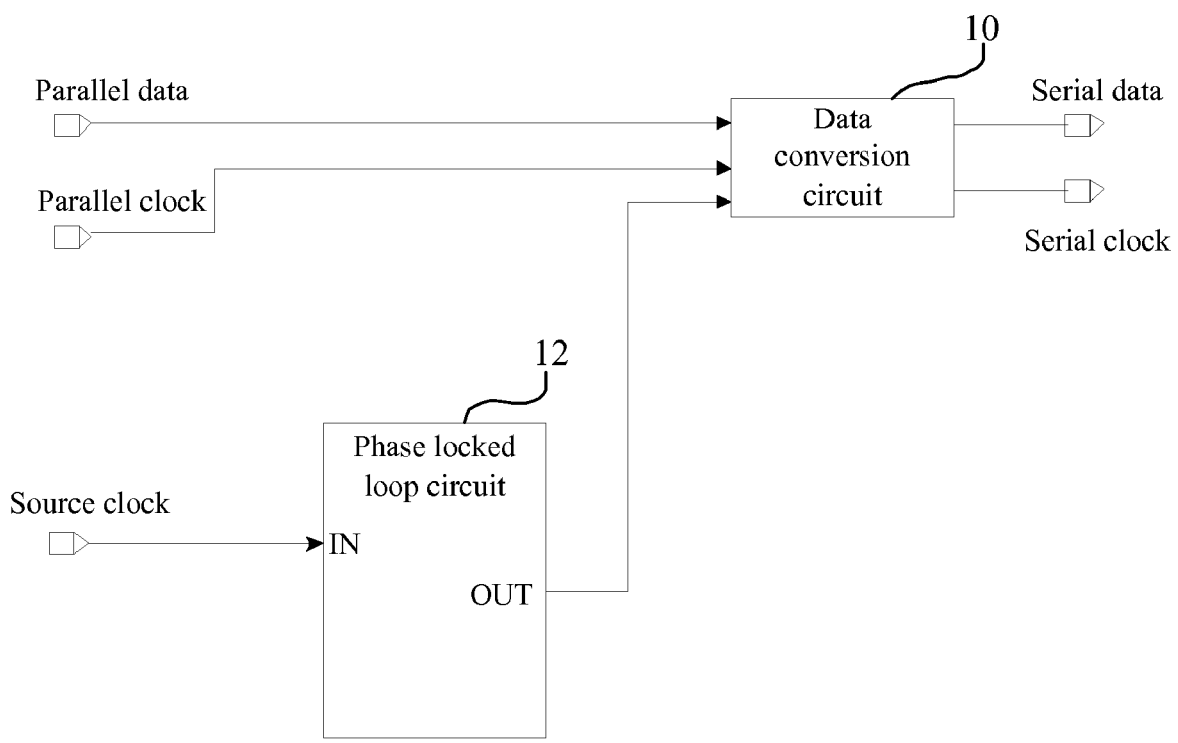
FIG. 1 is a diagram showing the structure of a parallel to serial conversion circuit in the prior art.
Figure 2:
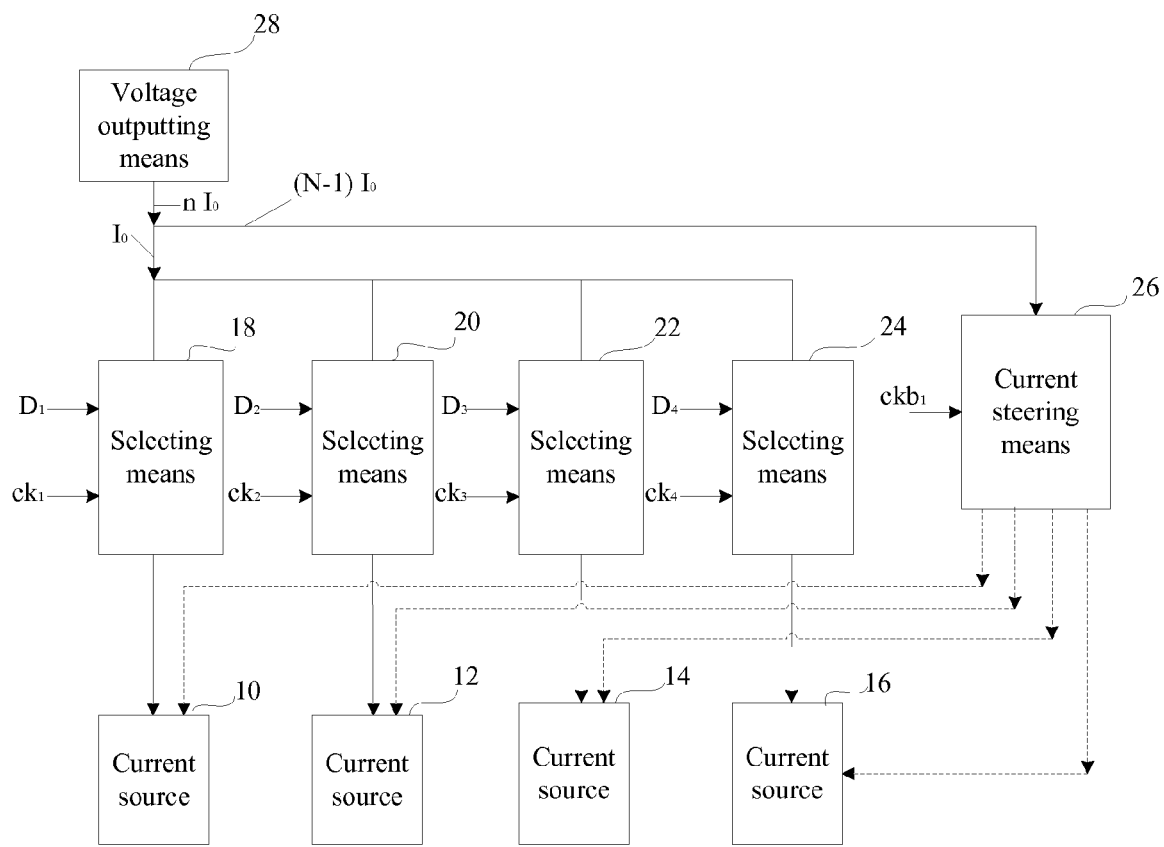
FIG. 2 is a diagram showing the structure of another parallel to serial conversion circuit in the prior art.
Figure 3:
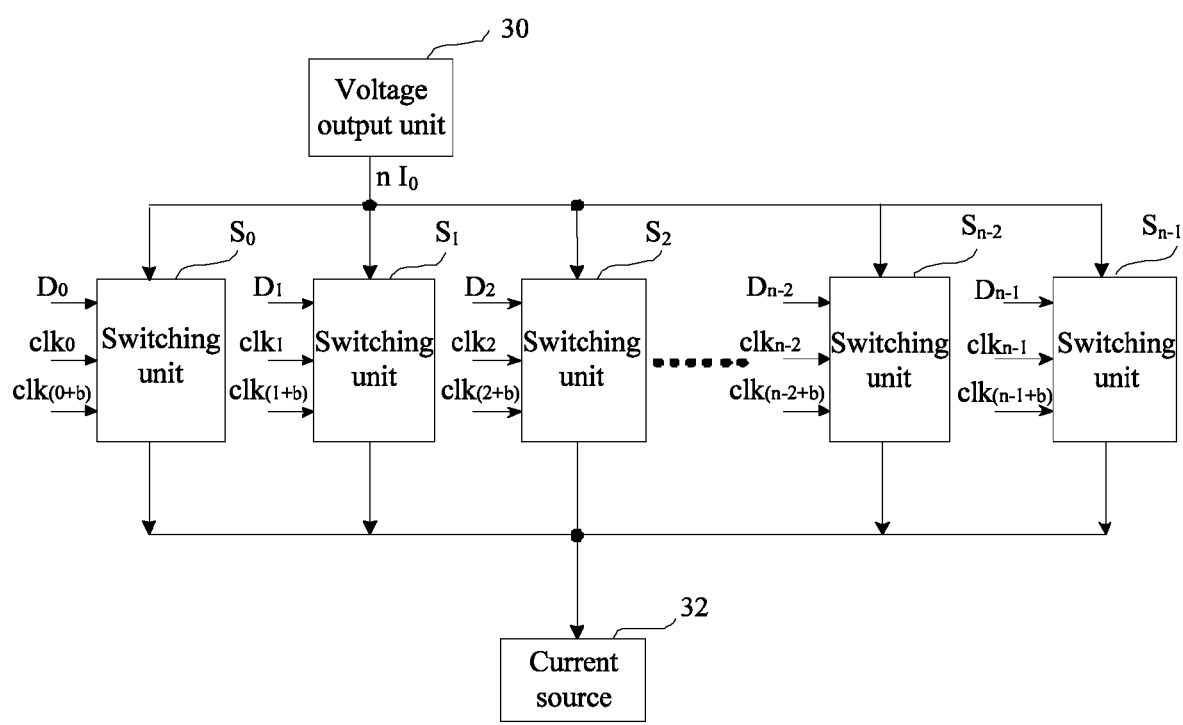
FIG. 3 is a diagram showing the structure of a parallel to serial conversion circuit according to an embodiment of the present invention.

Embodiments of the present invention are described in detail below with reference to the accompanying drawings. FIG. 3 is a diagram showing the structure of a parallel to serial conversion circuit according to an embodiment of the present invention, and the parallel to serial conversion circuit of FIG. 3 includes a voltage output unit 30, a plurality of switching units $S_0, S_1, S_2 \ldots S_{n-2}, S_{n-1}$ connected to the voltage output unit 30, and a common current source 32 connected to the plurality of switching units $S_0, S_1, S_2 \ldots S_{n-2}, S_{n-1}$.

The voltage output unit 30 provides an operating voltage for the plurality of switching units $S_0, S_1, S_2 \ldots S_{n-2}, S_{n-1}$. In the present embodiment, the voltage output unit 30 provides a differential output and the operating voltage corresponds to the number of data bits in the parallel data to be converted into serial data. Given that the number of data bits is N, the value of a voltage across a resistor with an resistance or impedance R may be the product of a current $N*I_0$ and the resistance or impedance R, i.e. $N*I_0*R$. Particularly, the voltage output unit 30 may output a high voltage level $V_{dd}$ and a low voltage level $V_{ss}=V_{dd}-N*I_0*R$, with a differential value between the high voltage level and the low voltage level being $N*I_0*R$.

The plurality of switching units $S_0, S_1, S_2 \ldots S_{n-2}, S_{n-1}$ each are connected to the voltage output unit 30. In the present embodiment, the number of the switching units corresponds to the number of data bits in the parallel data to be converted into the serial data, and each switching unit corresponds to one data bit in the parallel data received. In other words, N switching units are required for an N-to-1 parallel to serial conversion of parallel data with N data bits. For example, four, eight or ten switching units are required for a four-to-one, eight-to-one or ten-to-one parallel to serial conversion.

Each switching unit receives in operation a first clock signal and a second clock signal. In the present embodiment, particularly, the plurality of switching units $S_0, S_1, S_2 \ldots S_{n-2}, S_{n-1}$ are respectively connected to a plurality of first clock signals $CLK_0, CLK_1, CLK_2 \ldots CLK_{n-2}, CLK_{n-1}$ and a plurality of second clock signals $CLK_{(0+b)}, CLK_{(1+b)}, CLK_{(2+b)} \ldots CLK_{(n-2+b)}, CLK_{(n-1+b)}$, so that each of the switching units $S_0, S_1, S_2 \ldots S_{n-2}, S_{n-1}$ may receive the first and second clock signals. The first clock signals $CLK_0, CLK_1, CLK_2 \ldots CLK_{n-2}, CLK_{n-1}$ and the second clock signals $CLK_{(0+b)}, CLK_{(1+b)}, CLK_{(2+b)} \ldots CLK_{(n-2+b)}, CLK_{(n-1+b)}$ have the same frequency. In the present embodiment, particularly, the first and second clock signals have a frequency same as the clock frequency of the parallel transmission system for parallel data transmission.

Further, two of the first clock signals $CLK_0, CLK_1, CLK_2 \ldots CLK_{n-2}, CLK_{n-1}$ or two of the second clock signals $CLK_{(0+b)}, CLK_{(1+b)}, CLK_{(2+b)} \ldots CLK_{(n-2+b)}, CLK_{(n-1+b)}$, which are received by adjacent two of the plurality of switching units $S_0, S_1, S_2 \ldots S_{n-2}, S_{n-1}$, have a phase difference $$\Delta t = \frac{T}{N}$$

therebetween, where $\Delta t$ denotes the phase difference, T denotes a period of the system clock for the parallel data, and N denotes the number of data bits in the parallel data. For example, in the present embodiment, the first and second clock signals $CLK_0$ and $CLK_{(0+b)}$ are received by the switching unit $S_0$ and the first and second clock signals $CLK_1$ and $CLK_{(1+b)}$ are received by the switching unit $S_1$ adjacent to the switching unit $S_0$, in this case, a phase difference $$\Delta t = \frac{T}{N}$$

exists between the first clock signals $CLK_0$ and $CLK_1$ and a phase difference $$\Delta t = \frac{T}{N}$$

exists between the second clock signals $CLK_{(0+b)}$ and $CLK_{(1+b)}$.

In addition, a phase shift exists between the second clock signal and the first clock signal received by each switching unit, so that each switching unit may receive one respective data bit in the parallel data within a time window corresponding to the phase shift. In the present embodiment, for example, the first and second clock signals $CLK_0$ and $CLK_{(0+b)}$ are received by the switching unit $S_0$, thus a phase shift $$Ps = b*\Delta t = (N/2+1)*\frac{T}{N}$$

exists between the first and second clock signals $CLK_0$ and $CLK_{(0+b)}$, where Ps denotes the phase shift, b denotes a sequence difference of the adjacent clock signals, T denotes a period of the system clock for the parallel data, and N denotes the number of data bits in the parallel data. Further, the time window determined by the first and second clock signals is $$\Delta t = \frac{T}{N},$$

where $\Delta t$ denotes the time window, T denotes a period of the system clock for the parallel data, and N denotes the number of data bits in the parallel data. Thus, only one switching unit is allowed to receive corresponding one data bit in the parallel data within a time window. In other words, each time only one switching unit is active and receives and converts a data bit within the respective time window. As a result, each switching unit may be active for one time and receive one data bit in the parallel data within one period of the system clock in the context of the system clock frequency, so that all data bits in the parallel data may be converted into the serial data, for example, the parallel data with N bits may be converted into the serial data with N bits.

The common current source 32 is connected to each of the plurality of switching units $S_0, S_1, S_2 \ldots S_{n-2}, S_{n-1}$. In the present embodiment, a current always flows through the common current source 32 at any time, because there must be active one of the switching units $S_0, S_1, S_2 \ldots S_{n-2}, S_{n-1}$ to receive and convert the data bit at any time. The amount of the current flow may be substantially constant, for example, the current may be $N*I_0$, so that the current flowing through the common current source 32 is always stable, without large increase or decrease in the amount of the current, as a result, stability of the system is improved, and the accuracy of judging logical values of data bits in the obtained serial data is improved, thus avoiding the misjudgment due to a short time of a stable state because of the large variations in the current of the current source.

Figure 4:
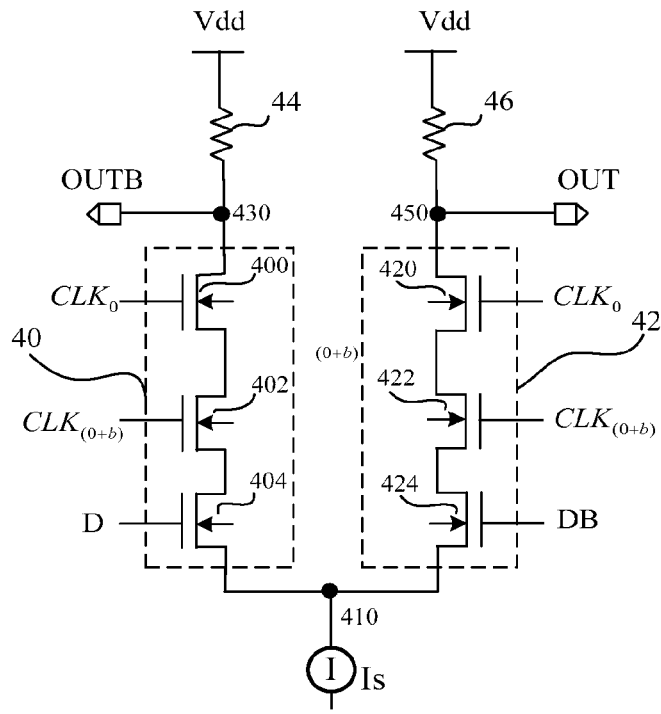
FIG. 4 is a diagram showing the structure of an exemplary switching unit of FIG. 3.

With reference to FIG. 4, the structure of an exemplary switching unit of FIG. 3 is shown. In the present embodiment, the switching unit is described by way of an example of a differential pair of MOS Current Mode Logics (MCML). As shown in FIG. 4, for example, the switching unit includes a first group of serial-connected transistors 40, a second group of serial-connected transistors 42, a first pull-up device 44 and a second pull-up device 46. It is noted that the switching unit as shown in FIG. 4 is merely illustrative and is not intended to limit the scope of the present invention. Actually, any variation may be made to the construction of the switching unit as long as the switching unit may receive the first and second clock signals having a frequency same as the system clock frequency for the parallel data and receive a data bit in the parallel data dependent upon the phase shift between the first and second clock signals to implement the parallel to serial conversion, for example, variations may be made on the number of the first group of serial-connected transistors 40 or the second group of serial-connected transistors 42, the arrangement of the transistors, and the way and position of receiving the signals.

The first group of serial-connected transistors 40 includes a first transistor 400, a second transistor 402 and a third transistor 404, which are connected serially. A gate of the first transistor 400 is used to receive a first clock signal $CLK_0$, a gate of the second transistor 402 is used to receive a second clock signal $CLK_{(0+b)}$, and a gate of the third transistor 404 is used to receive a data bit D in the parallel data. In the present embodiment, the first transistor 400, the second transistor 402 and the third transistor 404 are described by way of an example of NMOS transistors.

The second group of serial-connected transistors 42 includes a fourth transistor 420, a fifth transistor 422 and a sixth transistor 424, which are connected serially. A gate of the fourth transistor 420 is used to receive a first clock signal $CLK_0$, a gate of the fifth transistor 422 is used to receive a second clock signal $CLK_{(0+b)}$, and a gate of the sixth transistor 424 is used to receive a logical complement value DB of a data bit in the parallel data. In the present embodiment, the fourth transistor 420, the fifth transistor 422 and the sixth transistor 424 are described by way of an example of NMOS transistors.

In the first and second groups of serial-connected transistors 40 and 42, the third transistor 404 and the sixth transistor 424 are connected to a common conjunction point 410. In the present embodiment, the common conjunction point 410 is provided for the connection to the common current source Is described above.

The first pull-up device 44 is connected between the voltage output unit 30 (shown in FIG. 3) and the first transistor 400, and a voltage $V_{dd}$ is outputted by the voltage output unit 30. A conjunction point 430 between the first pull-up device 44 and the first transistor 400 is a second output terminal OUTB. In the present embodiment, the first pull-up device 44 may be a resistor or other electronic element with impedance, such as a transistor.

The second pull-up device 46 is connected between the voltage output unit 30 (shown in FIG. 3) and the fourth transistor 420, and a voltage $V_{dd}$ is outputted by the voltage output unit 30. A conjunction point 450 between the second pull-up device 46 and the fourth transistor 420 is a first output terminal OUT. Particularly, an output signal of the first output terminal OUT and an output signal of the second output terminal OUTB are complement values to each other. In the present embodiment, the second pull-up device 46 may be a resistor or other electronic element with impedance, such as a transistor.

Figure 5:
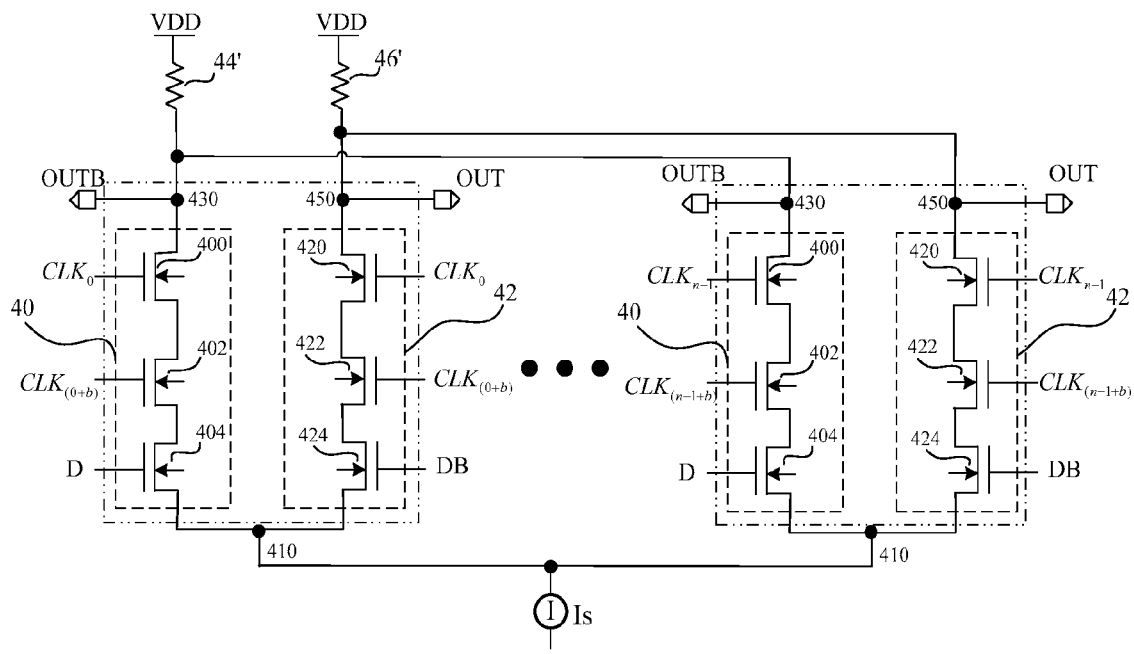
FIG. 5 is a diagram showing the structure of another exemplary switching unit of FIG. 3.

In the embodiment above, it is noted that the first group of serial-connected transistors 40, the second group of serial-connected transistors 42, the first pull-up device 44 and the second pull-up device 46 are included in the switching unit. The first and second pull-up devices act as loads. Actually, for simplifying the construction of the conversion circuit and optimizing the conversion circuit, in the case where multiple switching units are provided in the conversion circuit, it is possible not to provide the first and second pull-up devices for each switching unit separately, instead, only pull-up devices acting as loads for all the switching units may be provided in a trunk line of the conversion circuit. For example, as shown in FIG. 5, each of the switching units includes only the first transistor 400, the second transistor 402 and the third transistor 404 which are connected serially and the fourth transistor 420, the fifth transistor 422 and the sixth transistor 424 which are connected serially, while a first pull-up device 44' and a second pull-up device 46', which act as the loads, are provided in the trunk line, thereby relatively simplifying the construction of the circuit.

The CMOS process of a 0.13 um technology or 90 nm technology may be used in the above MCML. Further, the MCML may operate at a frequency at a level of GHz, for example, several GHz and 10 GHz.

The operation principle of the MCML includes that: under the control of the first and second clock signals, a high level is outputted by the first output terminal OUT when the logical value D of a data bit is a high level, and similarly, the logical complement value DB of the data bit is a high level and a high level is outputted by the second output terminal OUTB when the logical value D of the data bit is a low level. In the present embodiment, the high level is $V_{dd}$ and the low level is $V_{ss}=V_{dd}-N*I_0*R$.

Further, it is noted that although the transistors 400, 402, 404, 420, 422, 424 are described in the above embodiments by way of an example of NMOS transistors, the present invention is not limited to these. In practice, the transistors may be PMOS transistors, in this case, pull-down devices are used to replace the pull-up devices and used as the loads, and an illustrative circuit diagram is shown in FIG. 6, where the transistors are PMOS transistors in the MCML.

Figure 6:
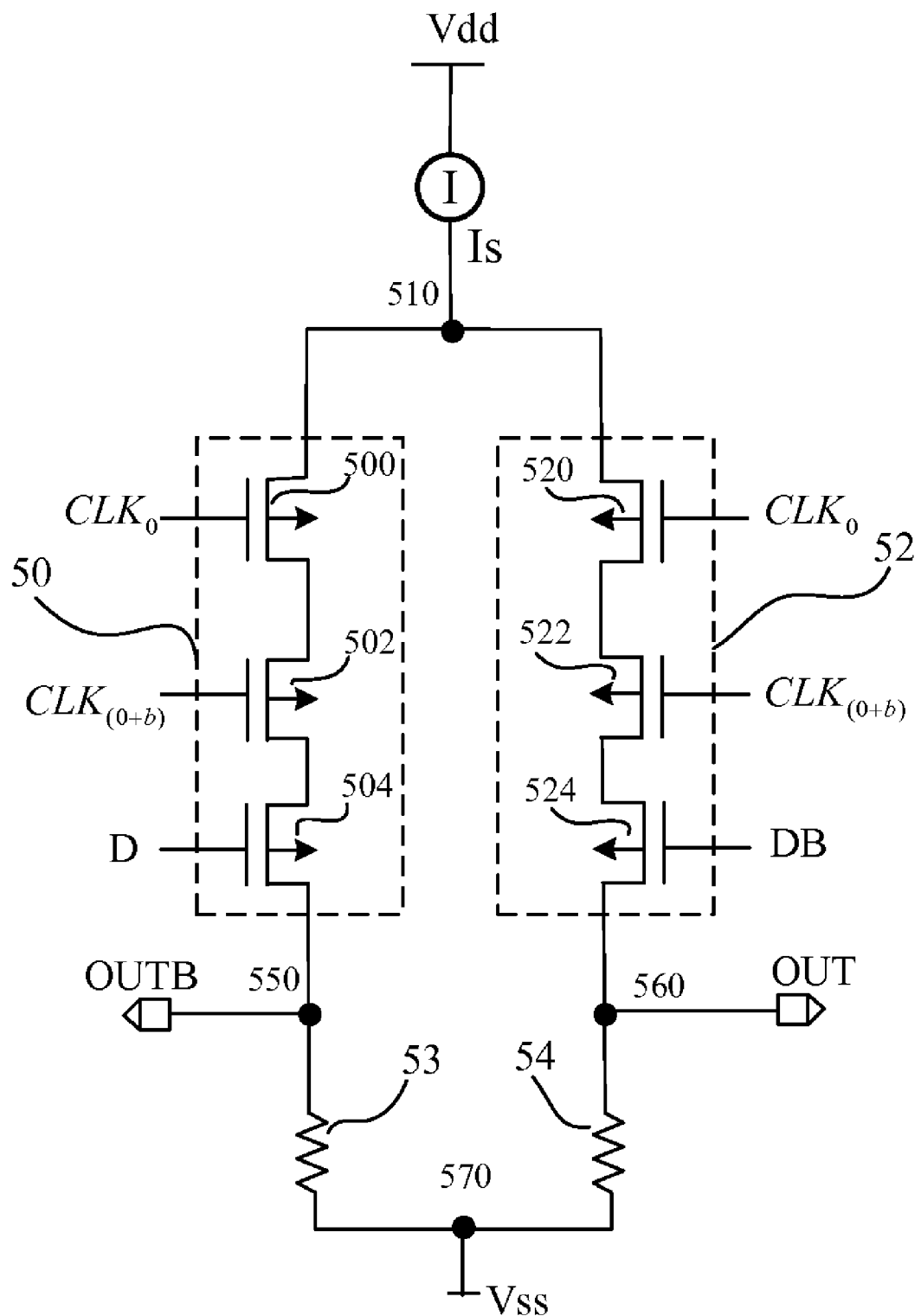
FIG. 6 is a diagram showing the structure of yet another exemplary switching unit of FIG. 3.

As shown in FIG. 6, the switching units includes a first group of serial-connected transistors 50, a second group of serial-connected transistors 52, a first pull-down device 53 and a second pull-down device 54. The first group of serial-connected transistors 50 includes a first transistor 500, a second transistor 502 and a third transistor 504, which are connected serially. A gate of the first transistor 500 is used to receive a first clock signal $CLK_0$, a gate of the second transistor 502 is used to receive a second clock signal $CLK_{(0+b)}$, and a gate of the third transistor 504 is used to receive a data bit D in the parallel data. The second group of serial-connected transistors 52 includes a fourth transistor 520, a fifth transistor 522 and a sixth transistor 524, which are connected serially. A gate of the fourth transistor 520 is used to receive a first clock signal $CLK_0$, a gate of the fifth transistor 522 is used to receive a second clock signal $CLK_{(0+b)}$, and a gate of the sixth transistor 524 is used to receive a logical complement value DB of a data bit in the parallel data.

In the first and second groups of serial-connected transistors 50 and 52, the first transistor 500 and the fourth transistor 520 are connected to a common conjunction point 510. In the present embodiment, the common conjunction point 510 is provided for a connection to the common current source Is.

The first pull-down device 53 is connected between a grounded voltage $V_{SS}$ and the third transistor 504, and a conjunction point 530 between the first pull-down device 53 and the third transistor 504 is a second output terminal OUTB. The second pull-down device 54 is connected between the grounded voltage $V_{ss}$ and the sixth transistor 524, and a conjunction point 560 between the second pull-down device 54 and the sixth transistor 524 is a first output terminal OUT. Particularly, an output signal of the first output terminal OUT and an output signal of the second output terminal OUTB are complement values to each other. In the present embodiment, the first and second pull-down devices 53 and 54 may be resistors or other electronic elements with impedance, such as transistors.

Figure 7:
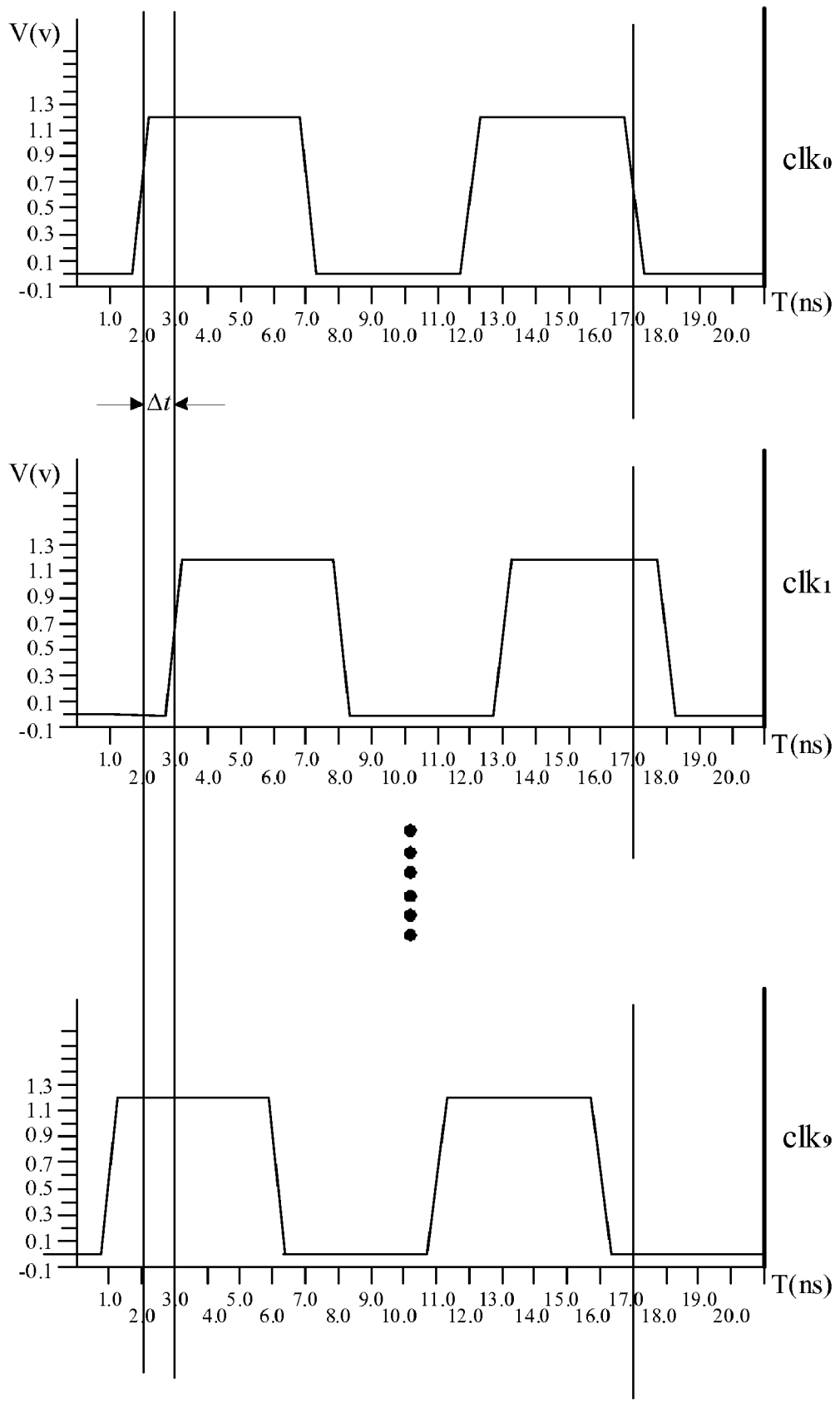
FIG. 7 is a schematic diagram showing periodic variations of first clock signals for a plurality of switching units according to an embodiment of the present invention.
Figure 8:
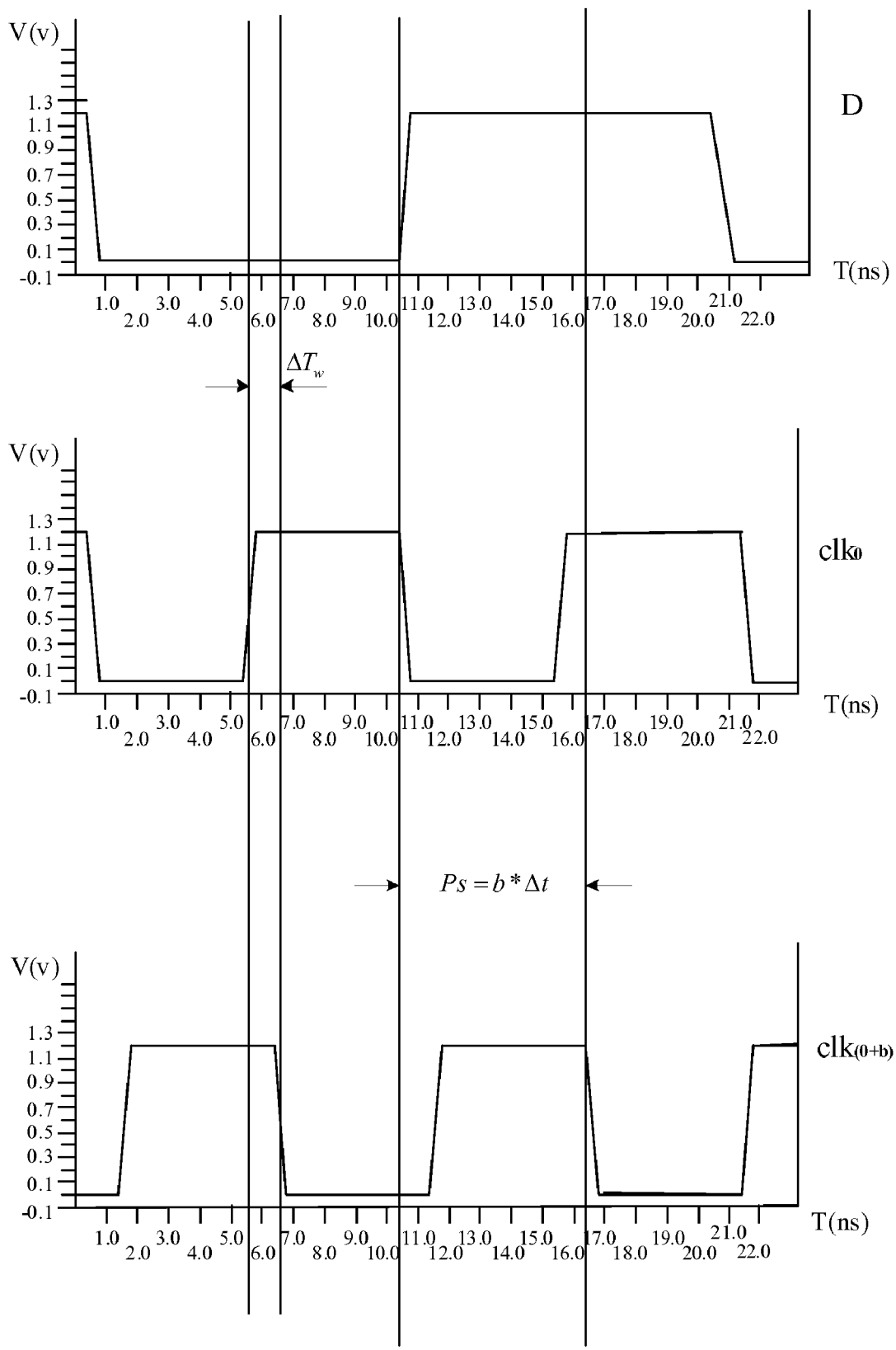
FIG. 8 is a schematic diagram showing periodic variations of a first and second clock signals when the switching unit is active by the application of the first and second clock signals according to an embodiment of the present invention.

With reference to FIGS. 7 and 8, a schematic diagram illustrating a period when parallel data is converted into serial data is shown by way of an example of parallel data with 10 data bits. In the present embodiment, a transmission rate of the parallel data is 100 MHz, that is, the system clock frequency f is 100 MHz, thus, a system clock period T is 10 ns, and a phase difference $$\Delta t = \frac{T}{N} = \frac{10}{10} = 1 \text{ ns}$$

exists between the first clock signals or the second clock signals, for example, between the first clock signals $CLK_1$ and $CLK_2$ or the second clock signals $CLK_{(1+b)}$ and $CLK_{(2+b)}$. A phase shift between the first clock signal and the second clock signal is $$Ps = b * \Delta t = (N/2 + 1) * \frac{T}{N} = (10/2 + 1) * 1 = 6 \text{ ns,}$$

that is, the second clock signal may be formed by shifting the first clock signal to the right by 6 ns. The embodiment is described below by way of an example of a switching unit $S_0$. As shown in FIG. 8, a schematic diagram illustrating waveforms of the first clock signal $CLK_0$ and the second clock signal $CLK_{(0+b)}$ for the first switching unit $S_0$ is shown. The phase shift between the first clock signal $CLK_0$ and the second clock signal $CLK_{(0+b)}$ provided to the switching unit $S_0$ is $Ps=b*\Delta t=6\Delta t=6$ ns, and a time window $\Delta T_w$ when the switching unit $S_0$ is active and converts data bits may be obtained by performing a logical operation of "AND" on the first clock signal $CLK_0$ and the second clock signal $CLK_{(0+b)}$. As shown in FIG. 8, the time window is $$\Delta T_w = \frac{T}{N} = \frac{10}{10} = 1 \text{ ns.}$$

That is, each switching unit occupies a time window $$\Delta T_w = \frac{T}{N},$$

and a sum of time windows occupied by all of N switching units is $$N * \Delta t = N * \frac{T}{N} = T,$$

i.e. one system clock period. Thus, only one switching unit is allowed to be active at any time, at the same time the other switching units are non-active, and it is ensured that each of all the switching units may be active for one time and convert one data bit within one system clock period, as a result, all data bits in the parallel data may be received and converted into serial data within one system clock period, for example, the parallel data with N bits may be converted into the serial data with N bits.

As can be seen from the above, in the inventive solution, a plurality of switching units corresponding to data bits of parallel data are provided, each of the plurality of switching units is provided with a first clock signal and a second clock signal having the same frequency, a phase shift exists between the first and second clock signals, and a phase difference exists between the first clock signals for the adjacent two switching units of the plurality of switching units, so that all data bits of the parallel data may be converted into serial data within one clock period. In comparison with the prior art, the frequency of each of the first and second clock signals in the solution above is the same as the clock frequency of the parallel transmission system. In other words, actually a single system clock frequency is used, thus it is not necessary to obtain a clock signal frequency equal to the product of the system clock frequency and the number of data bits of the parallel data through the frequency multiplying processing, or obtain several clock frequencies by means of frequency division, so that devices for the frequency multiplying or frequency division are omitted, and the complexity and power consumption of the system is reduced.

In addition, a common current source connected to the plurality of switching units is further provided in the solution of the present invention, so that the plurality of switching units may share the same tail current, ensuring a stable state where the tail current is always active, avoiding the defect in the prior art that the amplitude of a data bit is susceptible and the data bit may be misjudged due to the instability of the tail current at its rising edge and falling edge, because the switching units each are connected to the respective current sources.

The invention is described with, but is not limited to, the preferred embodiments described above, and various alternations and modifications can also be made to the invention by those skilled in the art without departing from the scope of the invention. Therefore, the scope of the invention is defined by the appending claims.

The invention claimed is:

1. A parallel to serial conversion circuit, comprising:
   a plurality of switching units, each of which is operable to receive a first clock signal and a second clock signal which have the same frequency, a phase shift exists between the first clock signal and the second clock signal for each of the plurality of switching units, and a phase difference exists between the first clock signals received by adjacent two switching units of the plurality of switching units, the plurality of switching units is further adapted to receive data bits of parallel data in sequence according to the phase difference, wherein each of the plurality of switching units receives one data bit within a time window corresponding to the phase shift; and
   a voltage output unit adapted to provide an operating voltage for the plurality of switching units.

2. The parallel to serial conversion circuit of claim 1, further comprising a common current source connected to each of the plurality of switching units.

3. The parallel to serial conversion circuit of claim 1, wherein the switching unit comprises a current-mode logic circuit.

4. The parallel to serial conversion circuit of claim 3, wherein the current-mode logic circuit comprises:
   a first group of serial-connected transistors comprising a first transistor, a second transistor and a third transistor, wherein a control terminal of the first transistor receives a first clock signal, a control terminal of the second transistor receives a second clock signal, and a control terminal of the third transistor receives one data bit of the parallel data;
   a second group of serial-connected transistors comprising a fourth transistor, a fifth transistor and a sixth transistor, wherein a control terminal of the fourth transistor receives the first clock signal, a control terminal of the fifth transistor receives the second clock signal, and a control terminal of the sixth transistor receives a logical complement value of one data bit of the parallel data;

a first pull-up device connected between the voltage output unit and the first transistor; and a second pull-up device connected between the voltage output unit and the fourth transistor;

wherein the third and the sixth transistors are connected to a common conjunction point, a conjunction point between the first pull-up device and the first transistor is a second output terminal, a conjunction point between the second pull-up device and the fourth transistor is a first output terminal, and an output signal from the first output terminal and an output signal from the second output terminal are logical complement values with respective to each other.

5. The parallel to serial conversion circuit of claim 4, wherein the first, second, third, fourth, fifth and sixth transistors in the current-mode logic circuit are field effect transistors, and the control terminals are gates of the field effect transistors.

6. The parallel to serial conversion circuit of claim 1, wherein a phase difference between two first clock signals of the adjacent two switching units of the plurality of switching units is $$\Delta t = \frac{T}{N},$$

wherein, $\Delta t$ denotes the phase difference, T denotes a period of a system clock for the parallel data, and N denotes the number of data bits in the parallel data.

7. The parallel to serial conversion circuit of claim 1, wherein the phase shift is:

$$Ps = b*\Delta t = (N/2 + 1)*T/N$$

wherein Ps denotes the phase shift, b denotes a sequence difference of adjacent clock signals, T denotes a period of the system clock for the parallel data, and N denotes the number of data bits in the parallel data.

8. The parallel to serial conversion circuit of claim 1, wherein the time window is:

$$\Delta T_w = \frac{T}{N}$$

wherein $\Delta T_w$ denotes the time window, T denotes a period of the system clock for the parallel data, and N denotes the number of data bits in the parallel data.

* * * * *